United States Patent
Witte

(10) Patent No.: US 6,876,220 B2
(45) Date of Patent: *Apr. 5, 2005

(54) SYSTEM AND METHOD FOR MEASURING FAULT COVERAGE IN AN INTEGRATED CIRCUIT

(75) Inventor: Jeffrey Paul Witte, Ft. Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 10/627,564

(22) Filed: Jul. 25, 2003

(65) Prior Publication Data

US 2004/0017213 A1 Jan. 29, 2004

Related U.S. Application Data

(63) Continuation of application No. 10/184,496, filed on Jun. 28, 2002, now Pat. No. 6,714,035.

(51) Int. Cl.$^7$ ............................................... G01R 31/26
(52) U.S. Cl. ...................................... 324/765; 324/750
(58) Field of Search .............................. 324/765, 750, 324/752, 158.1, 751; 250/305, 310; 714/724, 734

(56) References Cited

U.S. PATENT DOCUMENTS

| | | |
|---|---|---|
| 4,716,564 A | 12/1987 | Hung et al. |
| 5,189,365 A | 2/1993 | Ikeda et al. |
| 5,483,544 A | 1/1996 | Shur |
| 5,521,516 A | 5/1996 | Hanagama et al. |
| 5,712,857 A | 1/1998 | Whitman et al. |
| 5,905,577 A | 5/1999 | Wilsher et al. |
| 5,930,588 A | 7/1999 | Paniccia |
| 6,059,451 A | 5/2000 | Scott et al. |
| 6,072,179 A | 6/2000 | Paniccia et al. |
| 6,177,989 B1 | 1/2001 | Bruce |

*Primary Examiner*—David Zarneke
*Assistant Examiner*—Tung X. Nguyen

(57) ABSTRACT

A system and method for measuring fault coverage in an integrated circuit (IC) using a stuck-at fault model is disclosed. The system includes a Device Under Test (DUT) assembly having the IC that includes at least one node, a probe and a test pattern generator and interface system. The DUT's nodes are operable to be stimulated to a stuck-at fault state when stimulated by a certain frequency of electromagnetic (EM) radiation, which fault state is operable to be discovered by a suitable test vector set.

15 Claims, 4 Drawing Sheets

| a | b | z | a/0 | a/1 | b/0 | b/1 | z/0 | z/1 |
|---|---|---|-----|-----|-----|-----|-----|-----|
| 0 | 0 | 1 | 1 | 1 | 1 | 1 | [0] | 1 |
| 0 | 1 | 1 | 1 | [0] | 1 | 1 | [0] | 1 |
| 1 | 0 | 1 | 1 | 1 | 1 | [0] | [0] | 1 |
| 1 | 1 | 0 | [1] | 0 | [1] | 0 | 0 | [1] |
| POSSIBLE FTVs | | | {1,1} | {0,1} | {1,1} | {1,0} | {(0,0)(0,1)(1,0)} | {1,1} |
| MINIMUM FTV SET | | | T: {(0,1), (1,0), (1,1)} | | | | | |

SYSTEM AND METHOD FOR MEASURING FAULT COVERAGE IN AN INTEGRATED CIRCUIT

CROSS-REFERENCE TO RELATED APPLICATION(S)

Claim of priority under 35 U.S.C. §120 & 37 C.F.R. §1.78 and this nonprovisional application is a continuation application claiming the benefit of the following prior U.S. patent application entitled: "System and Method for Measuring Fault Coverage In an Integrated Circuit," application Ser. No. 10/184,496, filed Jun. 28, 2002 now U.S. Pat. No. 6,714,035, in the name(s) of Jeffrey Paul Witte, which is hereby incorporated by reference.

BACKGROUND OF THE INVENTION

1. Technical Field of the Invention

The present invention generally relates to integrated circuits. More particularly, and not by way of any limitation, the present invention is directed to a system and method for measuring fault coverage in an integrated circuit.

2. Description of Related Art

The evaluation of the reliability and quality of a digital integrated circuit (IC) comprises several distinct testing phases including a verification phase, a parametric testing phase and a defect testing phase. The verification testing phase is the initial phase in which the first prototype chips are tested to ensure that they match their functional specification, that is, to verify the correctness of the design. The verification testing phase checks that all design rules are adhered to, from layout to electrical parameters. The parametric testing phase ensures components meet design specification for delays, voltages, power, etc.

The defect testing phase ensures that only defect-free production chips are packaged and shipped. The defect testing phase involves testing for a relatively large number of different physical defects that could be present. These physical defects may be classified by their logical fault effect on the functionality of the circuit. For example, permanent faults are physical defects which exist long enough to be observed. Temporary faults are physical defects which appear and disappear in short intervals of time. Delay faults are physical defects which affect the operating speed of the circuit. Sequential faults are physical defects which cause a combinational circuit to behave like a sequential circuit and occur in only certain technologies (e.g. CMOS).

One of the most practical methods for defect testing is to employ a fault model of the physical defects that can occur in the IC at a high level of abstraction, typically the logic level, and then develop algorithms, commonly referred to as Functional Test Vector (FTV) sets, for the modeled faults. Depending on the fault model and quality of the functional test vector set, the functional test vector set may cover a high percentage of the actual physical defects. The percent of all possible internal faults in an IC that are observable by the FTV set employed is referred to as the fault coverage. In general, the more robust and reliable fault models and associated FTV sets provide greater fault coverage.

Processes for automated fault testing of large scale integrated circuits commonly employ what is known as a "stuck-at" fault model to emulate permanent faults that may occur during fabrication of the integrated circuit under test. In this model, the circuit description is modified or otherwise rendered to correspond to a stuck-at fault state, i.e., a continuous logic state of 0 or 1. In a process known as fault simulation, the test vector sets developed based on the stuck-at fault model are applied to the IC and the value of the corresponding response is compared to the expected response value. After many faults are simulated and multiple test vectors run, an indication of the fault coverage of the applied test vector set is provided. If the fault coverage is unacceptably low, the test vector set may be modified to exercise portions of the circuit where undetectable faults lie.

Typically, fault coverage is measured via software fault simulations. In software fault simulations, a model of the IC is seeded with stuck-at faults and the functional test vector sets are run. This simulation is repeated thousands of times, seeding a different fault each time, to determine fault coverage.

It has been found, however, that as the size and complexity of ICs continues to grow, the software fault simulations do not provide fast and effective measurements of fault coverage. Moreover, software simulations provide a theoretical, not empirical, indication of fault coverage. Therefore, a need exists for a system and method for measuring fault coverage that is robust enough for today's production cycles that include ICs of ever-growing size and complexity. Additionally, a need exists for a system and method for measuring fault coverage that provides empirical data.

SUMMARY OF THE INVENTION

The present invention advantageously provides a system and method for measuring fault coverage that overcomes these and other drawbacks and deficiencies of the state-of-the art fault coverage solutions. The fault coverage scheme of the present invention provides for robust fault coverage measurement that is fast enough to be applied to the large amount of chips in today's production cycles that include ICs of ever-growing size and complexity. Moreover, an empirical measurement of fault coverage of actual devices is provided rather than a theoretical estimate.

The system includes a Device Under Test (DUT) assembly having an IC that includes at least one node, a probe, and a test pattern generator and interface system. The DUT's IC is operable to be stimulated to a stuck-at fault condition when stimulated by a certain frequency of electromagnetic (EM) radiation. The probe is operable to stimulate the DUT assembly with the certain frequency of EM radiation to create a temporary stuck-at-zero or stuck-at-one condition. The test pattern system generator and interface system interfaces with the DUT assembly to provide a test vector to the DUT and receive a corresponding response which is indicative of a fault coverage measurement.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
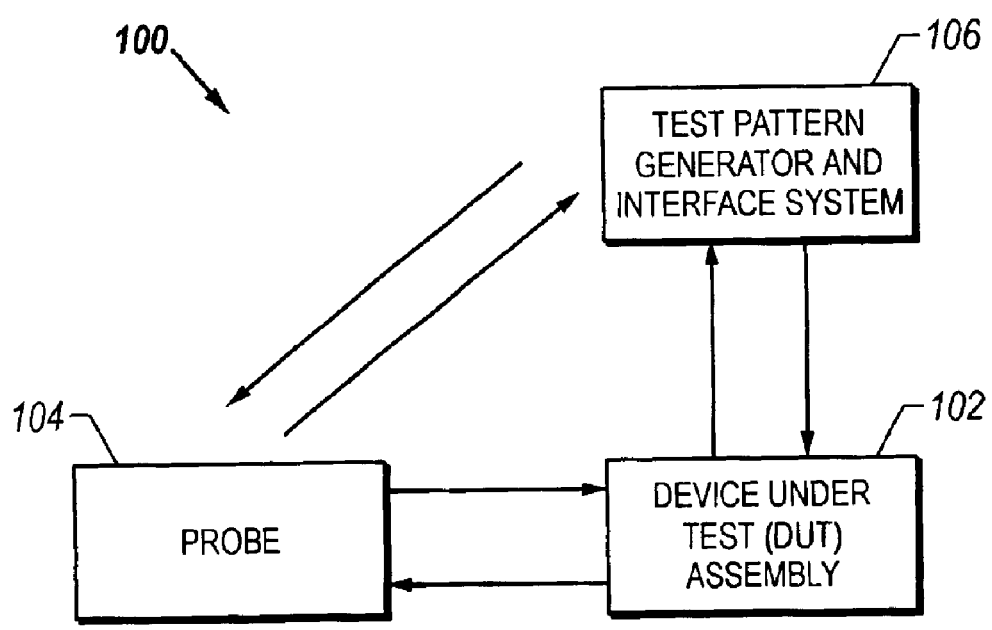
FIG. 1 depicts a functional block diagram of an embodiment for measuring fault coverage in accordance with the teachings of the present invention.

In the drawings, like or similar elements are designated with identical reference numerals throughout the several views thereof, and the various elements depicted are not necessarily drawn to scale. Referring now to FIG. 1, depicted therein is an exemplary system for measuring fault coverage in accordance with the teachings of the present invention which is generally designated 100. A Device Under Test (DUT) assembly 102 includes an integrated circuit (IC) of any digital design for which fault coverage information is desired. The DUT assembly 102 may comprise a digital circuit at the singulated die level, wafer level or chip level that may be either unpackaged or packaged. Moreover, the digital circuit can comprise a device of any known or heretofore unknown functionalities, such as, e.g., Field Programmable Gate Array (FPGA) devices or Application Specific Integrated Circuits (ASICs), microprocessors, microcontrollers, and memories. FPGAs may be any user-configurable logic device including a microprocessor. Also, the FPGA may take the form of a variety of devices which contain memory, for example, Electrically Erasable Programmable Read Only Memory (EEPROM or $E^2$PROM), Erasable Programmable Read Only Memory (EPROM), Flash EPROM, Static Random Access Memory (SRAM), fuse elements, anti-fuse elements, registers, and similar components. ASICs may be any chipset or chip, including a microprocessor, for example, that is custom-designed for a particular purpose or designed to perform multiple, generalized tasks. Alternatively, the digital circuit of the DUT assembly 102 may comprise a Programmable Array Logic (PAL) device, Electrically Programmable Logic Device (EPLD), or standard cell-based device.

A probe 104 probes the DUT assembly 102 and may be any device capable of generating temporary known fault conditions or states in the IC of the DUT assembly 102 while causing no permanent damage to the DUT. In an embodiment, the probe 104 is an electromagnetic (EM) generator such as a laser voltage probe. Alternatively, the probe may be an infra-red (IR) probe, an electron-beam (E-beam) probe, or an ion beam probe. As will be explained in more detail below, during a fault simulation, the probe 104 temporarily injects a stuck-at state at a particular node of the DUT assembly's IC.

A test pattern generator and interface system 106 interfaces with the DUT assembly 102 and may be disposed in a closed-loop communication relationship with the probe 104. Test pattern generator and interface system 106 generates Function Test Vectors (FTVs) and applies these as stimuli to the DUT assembly 102 during a fault simulation. Responses corresponding to the test stimuli are received from the DUT assembly 102 and compared with the expected values of the test responses, wherein the expected values are predetermined without taking into account any fault conditions at the tested node. If the observed value matches the expected value, the FTV set is not capable of detecting the failure, that is, the temporary injected stuck-at state. Conversely, if the observed value does not match the expected value, then the FTV is deemed to cover the failure.

The form factor of the interface between the DUT assembly 102 and test pattern generator and interface system 106 depends on the design and packaging of the DUT assembly 102. For example, in a typical packaged IC die, the packaging utilizes wire bonds to electrically connect bond pads in the IC die through metal interconnects to the pins of a package substrate which are electrically connected to the test pattern generator and interface system 106. Alternatively, if the DUT assembly 102 is packaged as a Controlled Collapse Chip Connection (C4) or "flip chip" package, then the IC die is flipped upside down. Accordingly, the interface between the DUT assembly 102 and the test pattern generator and interface system 106 may be a series of ball bonds positioned to provide direct electrical connects from the test head to the flip chip package and the DUT assembly 102.

Additionally, in one exemplary arrangement, the test pattern generator and interface system 106 is operable to communicate with the probe 104 in order to coordinate the control and timing of the fault simulation. Preferably, the coordination is accomplished via control signals, such as may be provided from a programmed general-purpose digital computer or other suitable source.

Figure 2:
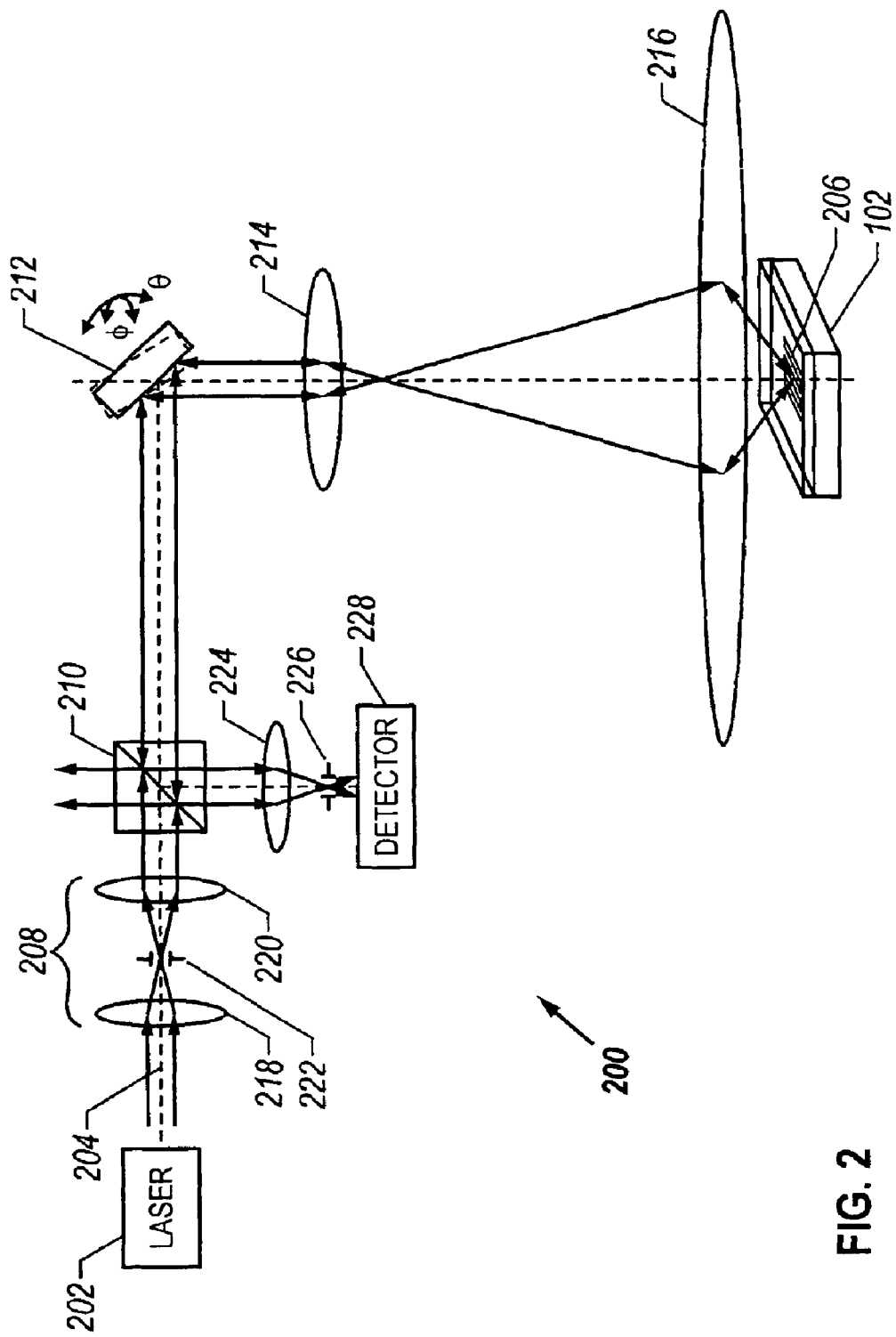
FIG. 2 depicts a schematic diagram illustrating an embodiment of a laser voltage probe for injecting a temporary stuck-at fault state into a Device Under Test (DUT) assembly in accordance with the teachings of the present invention.

FIG. 2 depicts an exemplary probe, a laser optics system 200, for injecting a temporary stuck-at fault state into a selected node of the DUT assembly's device in accordance with the teachings of the present invention. A laser 202 is positioned to focus an incident beam 204 onto a node 206 of the IC device included in the DUT assembly 102 via suitable optics. In one implementation, the optical arrangement includes a beam expander 208, a beam splitter 210, a mirror 212, a scan lens 214, and an objective lens 216. The beam expander 208 includes a pair of lenses 218 and 220 and a pinhole aperture 222 to provide spatial filtering of the incident laser beam 204 to approximate a source illumination. The reflected beams pass via objective lens 216, scan lens 214, mirror 212, beam splitter 210, lens 224 and aperture 226 to detector 228 for analysis.

The node 206 on the DUT assembly 102 can be interrogated with the incident laser beam 204 and due to the interactions with the beam 204, the reflected beam carries information about the node. The reflected laser beam is operable to provide the detector 208 with information which can include voltage, beam amplitude, phase modulations, electric field strength modifications, temperature changes, and polarization modulations, for example.

The laser probe system 200 is operable to inject a temporary stuck-at fault state at a selected node by sampling the node to determine when the node switches voltage level and correspondingly increasing the intensity of a particular frequency of the laser to temporarily inject a logic state of 0, i.e., a stuck-at-zero fault state. It should be understood by one skilled in the art that the illustrated laser probe system 200 is presented by way of example only. Accordingly, the probe system in general, or the laser probe in particular, may take several other forms.

Figures 3A, 3B:
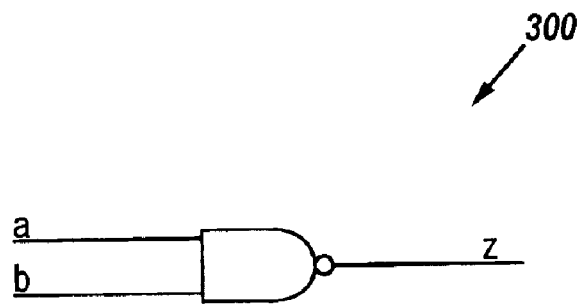
FIG. 3A depicts a schematic diagram illustrating an exemplary logic gate node of the DUT.
FIG. 3B depicts a table illustrating an exemplary test set generated with respect to the exemplary node of FIG. 3A.

FIG. 3A depicts an exemplary gate representation of a DUT's node. For the purposes of illustration and not by way of limitation, the DUT's node is represented as a NAND gate 300 having two input nodes a and b and an output z. It should be appreciated by those skilled in the art that although the DUT's node is illustrated as a NAND gate, any known logic gate representation of nodes is possible.

As previously discussed, FTV generation is the process of generating a set of FTVs or specific inputs to stimulate the inputs of a circuit, such that detectable faults can be exercised. This process can be divided into two distinct phases, derivation of a test and application of a test. In deriving a test, the appropriate model for the circuit and for the faults must be selected. To achieve a high degree of fault coverage, an FTV must be constructed such that the output signal from a fault circuit is different from that of a good circuit. Moreover, an ideal FTV set is efficient in both space (storage requirements for the patterns) and in time. The considerations in designing an FTV set include, for example, the time to construct a minimal test set, the size of the test pattern generator, the size of the test set itself, the time to load the test patterns, and the external equipment required.

In stuck-at fault modeling, the FTVs generated are based on the concept of sensitized paths. Given a line in a circuit, the sensitized path is the path that takes a possible error all the way to an observable output. For example, in order to sensitize a path which goes through one input of an AND gate to permit the sensitized signal to carry through, all other inputs of the gate must be set to logic 1.

It should be apparent that the IC devices manufactured today are extremely complicated and may involve tens of thousand of gates such as the ND gate illustrated in FIG. 3A. Therefore, typically, pseudo-random pattern generation and fault simulation are employed to design a suitable test vector set. In this strategy, a large set of patterns are generated pseudo-randomly with the aid of a hardware or software generator such as a Linear Feedback Shift Register (LFSR) or Linear Cellular Automata Register (LCAR). The pseudo-random set is used to stimulate a circuit, and during a fault simulation, the resultant FTV set may be evaluated for coverage.

Alternatively, the pseudo-random pattern generation may be supplemented with Automatic Test Pattern Generation (ATPG) programs employing powerful heuristics, such as Path Oriented Decision Making (PODEM) techniques. ATGP programs operate by listing the signals on the inputs of a gate controlling the line on which a fault should be detected, determining the primary input conditions necessary to obtain these signals (back propagation) and sensitizing the path to the primary outputs such that the signals and fault can be observed. This procedure may be repeated until all detectable faults in a given fault set have been covered.

More specifically, the design of an FTV set is explained in more detail by referring to FIG. 3B wherein an exemplary FTV set table 302 generated from the NAND gate 300 of FIG. 3A is illustrated. Column 304 indicates logic values at input nodes a and b and column 306 indicates the corresponding expected output z. For example, if the input of a is 0 and the input of b is 0, then the expected output of z is 1. Alternatively, if the input of a is 1 and the input of b is 1, then the expected output of z is 0.

The six columns, columns 308, 310, 312, 314, 316 and 318, illustrate the observed output under the presence of the indicated stuck-at fault. For example, in column 308, observed output a/0 illustrates the output under various input conditions in NAND gate 300 in presence of a stuck-at-zero condition at a. Within these columns, the output which permit the detection of the stuck-at fault are shown in a square. For example, with reference to columns 304, 306 and 308, if the input of a is 0, the input of b is 0 and a stuck-at fault 0 is present at a, then as indicated in column 308, the output value a/0 is 1. In this case, the expected value z and the observed value a/0 match. Thus, the FTV {0,0} would not screen the stuck-at fault a=0 in the NAND gate 300. Since the output bit of FTV {0,0} does not permit the detection of the stuck-at fault a=0, the output in column a/0 corresponding to these inputs is not shown in a square.

By way of a second example, again with reference to columns 304, 306 and 308, if the FTV {1,1} is exercised on the NAND gate 300 and if the input node a of the NAND gate 300 has a stuck-at-zero condition, then the observed value a/0 is 1. Therefore, the expected value z of a fault-free NAND gate and the observed value of the faulted gate are different. Thus, the FTV {1,1} would observe the stuck-at fault a=0 in the NAND gate 300. Since the output of FTV {1,1} permits the detection of the stuck-at fault a=0, it is shown in a square in the column a/0 308.

Row 320 indicates the FTVs that permit the detection of a stuck-at fault. Thus, FTV {1,1} is positioned under column a/0 in row 320 as the output of FTV {1,1} permits the detection of the stuck-at fault a=0. At the bottom of table 302, in row 322, a minimal FTV set is listed that includes the minimal number of distinct vectors necessary to detect all single stuck-at faults in the NAND gate 300.

Accordingly, if a stuck-at fault of 0 is temporarily injected by a probe at input node a and the DUT assembly was stimulated with an FTV set comprising {(0,0), (0,1), (1,1), (1,0)}, then only the FTV {1,1} would permit the detection of the stuck-at fault. Similarly, if input node b is temporarily injected with a stuck-at-one condition by a probe and the DUT assembly was stimulated with an FTV set comprising {(0,0), (0,1), (1,1), (1,0)}, only the FTV {1,0} would permit the detection of the stuck-at-one condition. As should be appreciated by one skilled in the art, the entire test vector set may be quickly tested at each node and fault coverage may then be determined.

As discussed, the percentage of all possible internal faults in an IC that are observable from the outside of the IC by the test vector set is referred to as the fault coverage detected with the test vector set. Thus, after many nodes are faulted during the simulation, and multiple functional test vectors run, an indication of the overall fault coverage of the functional test vector set may be calculated. For example, with reference to the FTV set table provided in FIG. 3B, the FTV set 322 is the minimum vector set that would provide 100% fault coverage of NAND gate 300. Alternatively, an FTV set comprising {(0,0), (1,0), (1,1)} would provide 83.33% fault coverage as the fault a=1 would not be detectable. Whether or not a particular level of fault coverage is acceptable depends on multiple factors including the complexity of the circuit, design constraints, and yield, for example. Accordingly, the empirical fault simulation of the present invention is more advantageous than existing theoretical software simulations. In particular, as DUT assemblies grow in complexity, software simulations become prohibitively time consuming and hence computationally expensive.

Figure 4:
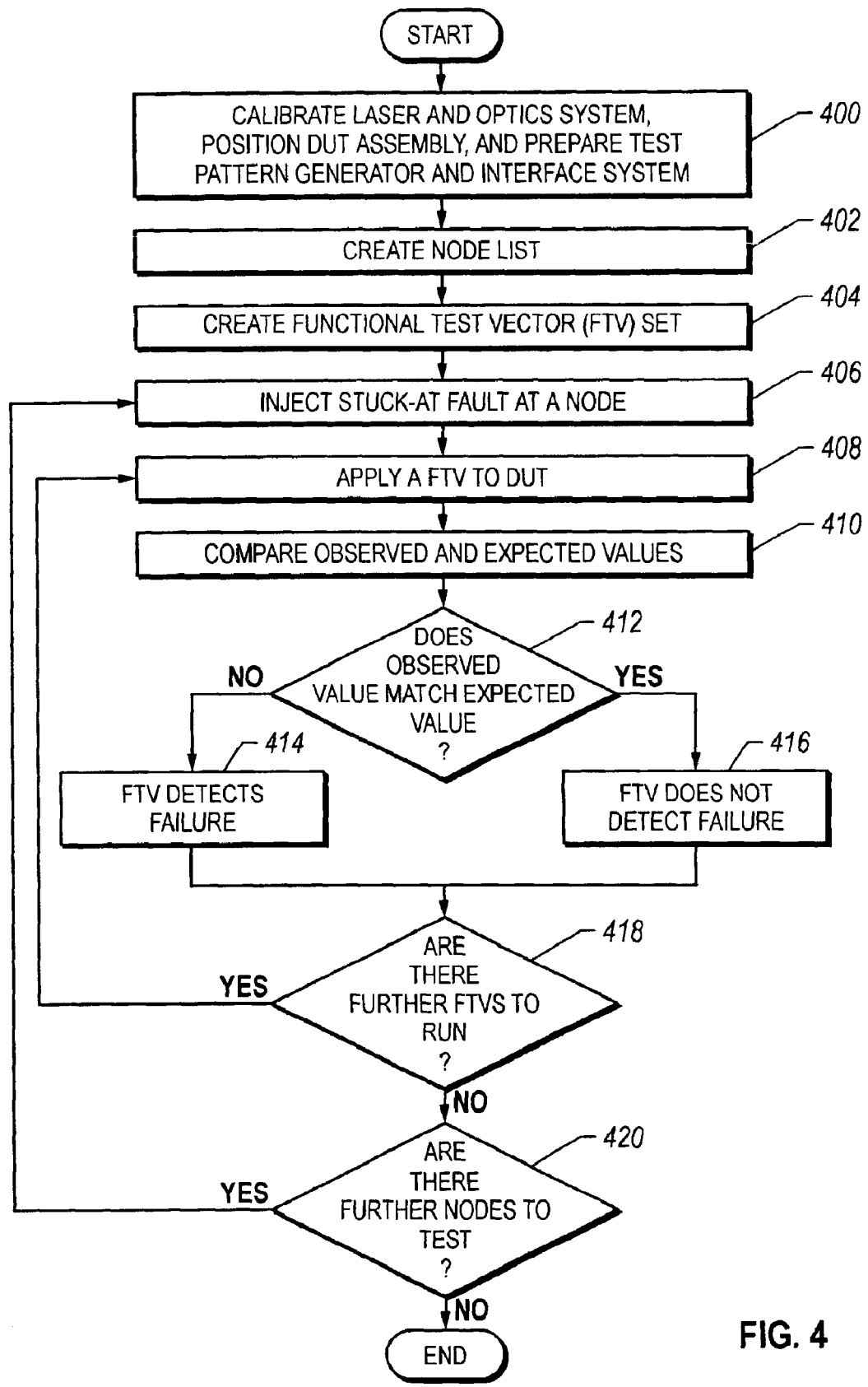
FIG. 4 depicts a flow chart of the various operations involved in an exemplary method for measuring fault coverage in accordance with the teachings of the present invention.

FIG. 4 depicts a flow chart of the various operations involved in an exemplary method for measuring fault coverage in accordance with the teachings of the present invention. At block 400, the equipment is prepared for the fault simulation. The probe is calibrated, the DUT assembly is positioned, and the test pattern generator and interface system is prepared and interfaced to the DUT assembly, for example. At block 402, a node list is created for the DUT's circuit that is going to be exercised. The node list may be a master node list which includes all the nodes of the circuit or a portion thereof. Typically, a master node list is determined based on the architecture of a circuit and may be readily available from the IC's design team. If a portion of the node list is tested, a randomized portion is selected in one embodiment.

At block 404, a suitable test vector set is created for implementation in conjunction with a stuck-at fault model of the IC. Those skilled in the art will realize that the FTV set used could also be prepared beforehand, by software or hardware or a combination thereof.

At block 406, a probe, such as, for example, the laser probe system of FIG. 2, injects a stuck-at fault at a node selected from the node list. An FTV is applied to the DUT assembly upon fault injection (block 408). Thereafter, the output from the DUT is compared against the expected results with respect to the applied test vector (block 410). If the observed value does not match the expected value as determined by decision block 412, then the test vector is operable to detect the failure (block 414). If the observed value matches the expected value, however, the FTV does not cover the failure (block 416).

At decision block 418, if additional test vectors are in the FTV set, extra iterations are performed as indicated by the process's return path to block 408. Due to the speed at which stuck-at faults can be created in a real device, each iteration takes only a fraction of a second. Thus, the FTVs may be empirically tested much faster than they can be theoretically tested by software simulation methods.

If no further FTVs need to be run, however, the process continues to decision block 420 where it is determined if further nodes need to be tested. If so, the process returns to block 406 for additional testing. If all the nodes on the node list have been tested, however, the process ends and fault coverage is determined as a percentage of the stuck-at fault conditions detected by the test vector set.

Based on the foregoing, it should be appreciated that the present invention provides a fault coverage system and method that advantageously overcomes the shortcomings and deficiencies of the existing solutions. The stuck-at fault model of the present invention can not only be implemented rapidly, but is particularly useful as well in terms of generating actual empirical coverage data. The resultant fault coverage scheme is thus reliable enough and fast enough to be incorporated in the testing of today's highly complex IC devices.

Although the invention has been described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A system for measuring fault coverage in an integrated circuit (IC), comprising:
   a Device Under Test (DUT) assembly including said IC, wherein said IC includes at least one node operable to be stimulated to a temporary stuck-at fault condition by a frequency of electromagnetic (EM) radiation;
   a probe operable to stimulate said DUT assembly with said frequency of EM radiation to create said temporary stuck-at fault condition at one or more nodes of said IC; and
   a test pattern generator and interface system interfacing with said DUT assembly, said test pattern generator and interface system operating to apply a test vector to said DUT assembly and receive a corresponding response, wherein said corresponding response is indicative of a fault coverage measurement.

2. The system for measuring fault coverage in an IC as recited in claim 1, wherein said IC is disposed on a die.

3. The system for measuring fault coverage in an IC as recited in claim 1, wherein said IC is disposed on a wafer.

4. The system for measuring fault coverage in an IC as recited in claim 1, wherein said IC is disposed on a packaged chip.

5. The system for measuring fault coverage in an IC as recited in claim 1, wherein said probe comprises a laser voltage probe.

6. The system for measuring fault coverage in an IC as recited in claim 1, wherein said temporary stuck-at fault condition comprises a stuck-at-zero condition.

7. The system for measuring fault coverage in an IC as recited in claim 1, wherein said temporary stuck-at fault condition comprises a stuck-at-one condition.

8. A method for measuring fault coverage in an integrated circuit (IC), comprising:
   stimulating a select number of nodes associated with said IC with a frequency of electromagnetic (EM) radiation;
   creating a temporary stuck-at fault condition at each of said select number of nodes;
   applying a test vector set to said IC upon creating said temporary stuck-at fault condition at each of said select number of nodes;
   comparing said IC's output against expected results associated with said test vector set; and
   determining fault coverage as a percentage of said temporary stuck-at fault conditions detected by said test vector set.

9. The method as recited in claim 8, wherein said frequency of EM is supplied by a laser voltage probe system.

10. The method as recited in claim 8, wherein said temporary stuck-at fault condition comprises a stuck-at-zero condition.

11. The method as recited in claim 8, wherein said temporary stuck-at fault condition comprises a stuck-at-one condition.

12. A system for measuring fault coverage in an integrated circuit (IC), comprising:
   means for stimulating a temporary stuck-at fault condition at each of a select number of nodes associated with said IC with a frequency of electromagnetic (EM) radiation;
   means for applying a test vector set to said IC upon creating said temporary stuck-at fault condition at each of said select number of nodes;
   means for comparing said IC's output against expected results associated with said test vector set; and
   means for determining fault coverage as a percentage of said temporary stuck-at fault conditions detected by said test vector set.

13. The system for measuring fault coverage in an IC as recited in claim 12, wherein said means for stimulating a temporary stuck-at fault condition comprises a laser voltage probe system.

14. The system for measuring fault coverage in an IC as recited in claim 12, wherein said temporary stuck-at fault condition comprises a stuck-at-zero condition.

15. The system for measuring fault coverage in an IC as recited in claim 12, wherein said temporary stuck-at fault condition comprises a stuck-at-one condition.

* * * * *